United States Patent
Erban

(10) Patent No.: US 6,858,791 B2
(45) Date of Patent: Feb. 22, 2005

(54) METHOD FOR MANAGING A PHOTOVOLTAIC SOLAR MODULE AND A PHOTOVOLTAIC SOLAR MODULE

(75) Inventor: Christof Erban, Herzogenrath Allemagne (DE)

(73) Assignee: Saint-Gobain Glass France, Courbevoie (FR)

(*) Notice: Subject to any disclaimer, the term of this patent is extended or adjusted under 35 U.S.C. 154(b) by 0 days.

(21) Appl. No.: 10/642,278

(22) Filed: Aug. 18, 2003

(65) Prior Publication Data

US 2004/0123894 A1 Jul. 1, 2004

Related U.S. Application Data

(63) Continuation of application No. PCT/FR02/00457, filed on Feb. 6, 2002.

(30) Foreign Application Priority Data

Feb. 17, 2001 (DE) .......................... 101 07 600

(51) Int. Cl.[7] ........................... H01L 31/042; H02J 7/35
(52) U.S. Cl. ....................... 136/244; 136/290; 136/291; 136/293; 323/906; 323/221
(58) Field of Search ................. 136/244, 290, 136/291, 293; 323/906, 221

(56) References Cited

U.S. PATENT DOCUMENTS

| | | | | |
|---|---|---|---|---|
| 3,896,368 A | * | 7/1975 | Rym ........................... | 323/224 |
| 4,175,249 A | | 11/1979 | Gruber ........................ | 323/271 |
| 4,243,928 A | * | 1/1981 | Nazimek ..................... | 320/101 |
| 4,328,456 A | * | 5/1982 | Suzuki et al. ................ | 320/101 |
| 4,494,063 A | * | 1/1985 | Callen et al. ................ | 320/101 |
| 5,001,415 A | * | 3/1991 | Watkinson ................... | 323/304 |
| 5,389,158 A | | 2/1995 | Fraas et al. .................. | 136/244 |
| 5,669,987 A | * | 9/1997 | Takehara et al. ............. | 136/244 |
| 6,350,944 B1 | * | 2/2002 | Sherif et al. ................. | 136/244 |
| 6,512,458 B1 | * | 1/2003 | Kobayashi et al. .......... | 340/635 |
| 6,593,520 B2 | * | 7/2003 | Kondo et al. ................ | 136/244 |
| 6,653,549 B2 | * | 11/2003 | Matsushita et al. .......... | 136/244 |

FOREIGN PATENT DOCUMENTS

| | | | |
|---|---|---|---|
| DE | 3335520 A1 | * | 4/1985 |
| DE | 42 08 469 A1 | | 9/1993 |
| EP | 0 896 737 B1 | | 9/2000 |
| JP | 58-219777 A | * | 12/1983 |
| JP | 59-225415 A | * | 12/1984 |
| JP | 60-179811 A | * | 9/1985 |

OTHER PUBLICATIONS

Derwent Abstract No. 1995–029522, (1995).*

* cited by examiner

*Primary Examiner*—Alan Diamond
(74) *Attorney, Agent, or Firm*—Oblon, Spivak, McClelland, Maier & Neustadt, P.C.

(57) ABSTRACT

In a solar module (1) comprising a plurality of individual solar cells (2) connected together electrically in series, with at least one solar cell (5, 6) exposed to the same conditions and not linked to the other solar cells, which serves as sensor of the instantaneous incident light on the solar module and with a switching device (8) able to be slaved at least indirectly to the sensor so as to act on the output electric power of the solar module, according to the invention, at least two solar cells (5, 6), which are disposed a large distance apart, are provided as sensors whose output voltages or currents are conveyed to an evaluation circuit (7) and are compared with one another by the latter, and the evaluation circuit (7) connects by means of the switching device (8) a shunt which bypasses the series circuit of the solar cells (2) of the solar module (1) when a difference which exceeds a threshold value exists between the outputs of the two sensors.

21 Claims, 2 Drawing Sheets

METHOD FOR MANAGING A PHOTOVOLTAIC SOLAR MODULE AND A PHOTOVOLTAIC SOLAR MODULE

CROSS-REFERENCE TO RELATED APPLICATIONS

This application is a continuation of the U.S. National Stage designation of co-pending International Patent Application PCT/FR02/00457, filed Feb. 6, 2002, the entire contents of which are expressly incorporated herein by reference thereto.

FIELD OF THE INVENTION

The invention relates to a process for managing a photovoltaic solar module as a function of incident light, and a photovoltaic solar module. The voltaic solar module comprises a plurality of individual solar cells connected together electrically in series, with at least one solar cell exposed to the same conditions, which serves as sensor of the instantaneous incident light on the solar module and with a switching device able to be slaved at least indirectly to the sensor so as to act on the output electric power of the solar module.

BACKGROUND OF THE INVENTION

When using photovoltaic installations exhibiting solar modules of large dimensions, the variable position of the sun in the course of the day always gives rise to partial shadowings of the surfaces equipped with solar cells, which are caused for example by neighboring constructions, antennas, trees, etc. Even when the surface in shadow is a small area, these passing shadows may give rise to appreciable losses of power of the system as a whole consisting of several identical modules. On the one hand, the input of light is directly decreased in the region of shadow so that the relevant module creates less electric power. Moreover, the solar cells of a module are as a general rule connected electrically in series. If the current (variable as a function of incident light) in the module (or the module part) in shadow decreases, it also limits at the same time the current of the neighboring cells, not in shadow, of the same module. Furthermore, the current is likewise limited by other modules connected in series.

To limit these inevitable disturbances, each solar module or each overall system is divided into a plurality of partial systems ("networks"). Each of these is furnished with its own rectifier ("network rectifier"). For the sake of standardization, these rectifiers have a minimum power of around 700 watts. This corresponds to the power created by a photovoltaic arrangement of around 7 to 8 $m^2$ in size.

In such an arrangement, a photovoltaic voltage which may reach around 500 to 600 volts is created and processed with modern electronic equipment and several modules connected in series, an individual solar cell having a working voltage of around 0.5 volts. Consequently, such a network can comprise around 1000 to 1200 individual solar cells. Strong local shadow on a small number of solar cells (1 to 5% of the total surface area) may then result in a loss of power of 75% over the system as a whole.

The known general technique for preventing the current from passing through solar cells in shadow or those which are damaged is by way of so-called shunt diodes, so that its decrease cannot act as strongly on the system as a whole. The shunt diode allows the flow of a short-circuit current when the internal resistance of the solar cell exceeds the voltage drop across the diode.

EP-0 896 737 B1 discloses a photovoltaic solar arrangement furnished with an integrated disconnection device which neutralizes the electric power of the module when it is activated by an external switching device. This device should moreover not limit the negative consequences of partial shadows, but render the relevant solar module inoperative if it has for example been dismantled in an unauthorized manner. Manipulations of this disconnection device are possible only after destruction of the module as a whole.

Solar elements are known (DE-A1-42 08 469), the solar cells of which serve as sensors for measuring the effective solar radiation. The value detected by these cells can for example be used to depict by means of display screens the instantaneous solar radiation on the relevant module.

U.S. Pat. No. 4,175,249 discloses an arrangement of photovoltaic solar cells with integrated control, in which an independent solar cell additional to a series of several current-creating identical solar cells is used merely as incident-light sensor. This solar cell serving as sensor is exposed to the same conditions of temperature and of light as the current-creating solar cells. Its no-load voltage is used as measurement signal, is amplified and compared with the instantaneous output voltage of the other cells. Depending on the result of this comparison, the solar cells of the arrangement can be connected automatically in various states of series and parallel connection by way of relays. On each occasion this should yield the maximum possible output charging voltage.

The invention relates to a process for managing a solar module as a function of incident light and, starting from an arrangement according to U.S. Pat. No. 4,175,249 mentioned above, to create a solar module that is improved from the standpoint of the effects of a partial shadow.

SUMMARY OF THE INVENTION

The invention relates to a process whose steps consist in:
detecting at least two variable measurement signals, which depend on the incident light, on at least two solar cells disposed some distance apart inside the solar module and defined as detection cells;
evaluating these measurement signals in an evaluation circuit;
by means of a switching device slaved to the evaluation circuit, bypassing the external connections of the solar module in the presence of a discrepancy between the measurement signals lying above a predetermined threshold value; and
removing the bypassing of the external connections when the discrepancy between the measurement signals lies below the threshold value.

According to one characteristic, electrical output signals (voltage, current) created directly by the detection cells are evaluated as measurement signals.

According to another characteristic, temperatures detected on the detection cells are evaluated as measurement signals.

The object of the invention is also achieved by virtue of the device which is characterized in that at least two solar cells of the solar module, which are disposed a large distance apart, are provided as sensors whose measurement signals created as a function of the instantaneous incident light are conveyed to an evaluation circuit and are compared with one another by the latter, and in that the evaluation circuit connects by means of the switching device a shunt which bypasses the series circuit of at least some of the solar cells of the solar module when a difference which exceeds a threshold value exists between the two measurement signals.

According to one characteristic, the solar cells defined as sensors are not integrated into the series circuit of the other solar cells and are linked only to the evaluation circuit for the transferring of the measurement signals.

According to another characteristic, the solar cells defined as sensors are integrated into the series circuit of the other solar cells and are linked in addition to the evaluation circuit for the transferring of the measurement signals.

Advantageously, the evaluation circuit and the switching circuit are disposed in the solar module proper.

According to yet another characteristic, there are provided a plurality of solar detection cells which are associated on each occasion in pairs with a defined part of the surface of the solar module, and in that for each of these surface parts, a switching device is provided on each occasion.

Preferably, the switching device is provided so as to separate the series circuit of the solar cells from at least one of the external connections upon activation by the evaluation circuit.

Advantageously, the solar cells used as sensors are disposed in proximity to the edge of the flat solar module.

The switching device advantageously comprises an electromechanical relay. As a variant, it comprises a semiconductor power switch able to be slaved.

Finally, the evaluation circuit switches the switching device into the quiescent state again when identical incident light is obtained on the two solar detection cells.

It is possible to envisage a series circuit of several solar modules comprising at least one solar module equipped according to the invention.

Starting from the automatic control of power of a solar module as a function of incident light, already known per se, the invention proposes that a partial shadow be detected automatically and that a shunt possibly be connected by comparing the incident light at at least two different locations of a flat module, which shunt makes it possible to prevent the current from entering the module (or the module part) associated with the relevant shadow. Thus, in practice the latter is "extracted from the array of modules" and the current which flows in the solar cells or additional modules connected in series and which are not in shadow is no longer blocked. Consequently, although the electric power of the disconnected module disappears for the duration of the shadowing or of the connection of the shunt, the instantaneous power of the other solar cells or of the other modules remains available to its full extent.

The said partial shadowing can be detected directly by evaluation, for example determination of the difference between the output voltages or currents of the detection cells. It is however also possible to use indirect detection by detecting for example the temperature differences caused by shadow in the detection cells and by evaluating them as differential signal in the evaluation circuit. Optionally, it is even possible to dispense with separation of the detection cells in relation to the other solar cells and to use them also for the creation of current in the series circuit.

In a development of the invention, for modules which exhibit a surface of particularly large dimensions, a multiplicity of solar detection cells is in any event provided, these cells on each occasion monitoring in pairs a defined part of the surface of the module and on each occasion being able to operate the controlled disconnection of this surface part. This makes it necessary moreover for appropriate switching devices to be provided in the module itself or for the output conductors of each of the surface regions capable of being separately connected to terminate outside, so that they can be bypassed there by means of the switching device.

Preferably, one of the two conductors is completely disconnected at the same time as the poles of the disconnected module, or of the disconnected part of the module, are bypassed. In this way the voltage which is still delivered by other modules is prevented from being applied to the module or the part of module disconnected and is prevented from possibly overcharging this module or this part. This separation may be effected easily by means of a contactor/inverter.

The switching device can comprise electromechanical or electronic switching means (relays, slaved semiconductor switch such as transistors, thyristors).

Moreover, the solar module will comprise an evaluation circuit, preferably electronic, which brings about the disconnection operation only within a specified field of tolerance or above a threshold value defined with respect to the difference between the detection signals. These latter may be derived equally well from the no-load voltage of the solar cells used as sensors or (if they are not connected in series) from their current, or else indirectly, as already indicated, from the instantaneous local temperature in the region of the detection cells, if this temperature can be determined by appropriate means.

An important advantage of this configuration of the solar module resides in that the solar detection cells may be solar cells of the same structure as those used for the production of current. Consequently, the solar modules can also be made as a surface of large dimensions by the thin-film technique, in addition to conventional crystalline technology. This has the advantage of subsequently being able to separate the individual solar cells from one another by structuration or splitting of the continuous films according to the state of the art, and in particular also of being able to separate the detection cells. It is only when the electrical connections are laid that the detection cells need to be treated separately. Their external connections may possibly have to be laid in a separate manner from those of the other solar cells (which have to be connected together in series).

In another embodiment, the detection cells are left in the series circuit and their effective voltage is detected by parallel voltage taps. These voltage signals may serve as input signal for the evaluation circuit after galvanic decoupling, for example by optocouplers. Likewise, an additional temperature sensor could be provided.

It goes without saying that the switching operations triggered by monitoring the momentary shadow, partial or local, are provided only in respect of the temporary disconnection of the solar module, and that therefore after homogeneous incident light has been reestablished on the solar detection cells which are relevant on each occasion, this module is automatically reactivated or hooked up to the array. Darkness building up or other regular shadows on the entire surface of the solar module have no effect on the switching device in its form described here.

Other details and advantages of the subject of the invention will emerge from the drawing of two exemplary embodiments and from their description which follows hereinbelow.

BRIEF DESCRIPTION OF THE DRAWINGS

Preferred features of the present invention are disclosed in the accompanying drawings, wherein similar reference characters denote similar elements throughout the several views, and wherein.

DETAILED DESCRIPTION OF PREFERRED EMBODIMENTS

Figure 1:
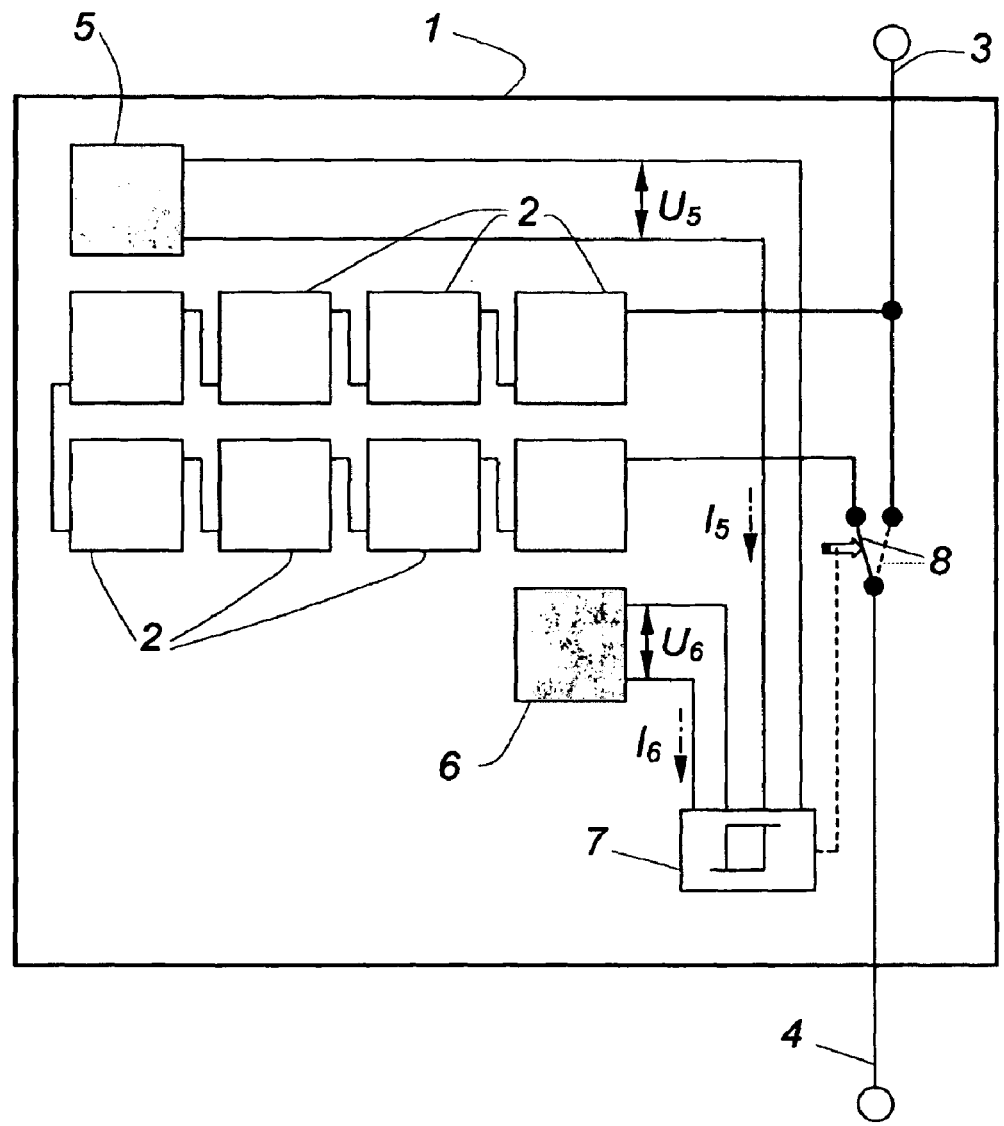
FIG. 1 represents a simplified wiring block diagram in accordance with a first embodiment of a solar module.

In FIG. 1, a plurality of solar cells 2 are connected together in a manner known per se in a photovoltaic solar module 1. The solar module 1 is moreover equipped with two external connections 3 and 4 to which, when operational, the output voltage of the arrangement of solar cells is applied or from which the electric power of the solar module 1 is tapped off. The shunt diodes already mentioned, which may be associated with individual solar cells or with groups of solar cells, have not been represented here for the sake of simplicity.

In most applications, several of these solar modules 1 are in turn connected together electrically in series so as thereby to obtain service voltages of several hundred volts. This implies that all of the current of the solar modules connected upstream must also pass through the module represented here. So if only the latter is in shadow, even partially, or if the incident light decreases on this module alone, its output power decreases. Its resistance increases and thus also blocks the flow of current of the other modules.

According to the invention, the solar module 1 moreover comprises a first solar cell 5 and a second solar cell 6 which are connected independently of the solar cells 2 and which are defined as detection cells for detecting the instantaneous incident light. In the actual embodiment, they are disposed a large distance apart, for example in proximity to the edge of the solar module 1. Their external connections, which on each occasion have been represented instead by a measurement voltage $U_5$ or $U_6$, are conveyed to an evaluation circuit 7 which is represented only symbolically. The latter is provided for the actuation of a switching device 8 whose manner of operation will be explained later. The measurement currents $I_5$ and $I_6$ which, in the evaluation circuit 7, may also serve as measurement of the instantaneous incident light on the detection cells 5 and 6, have also been represented by chain-dotted arrows.

The frame drawn around the solar module 1 symbolizes that with the exception of the external connections 3 and 4, all these components mentioned may be installed inside a module.

Figure 2:
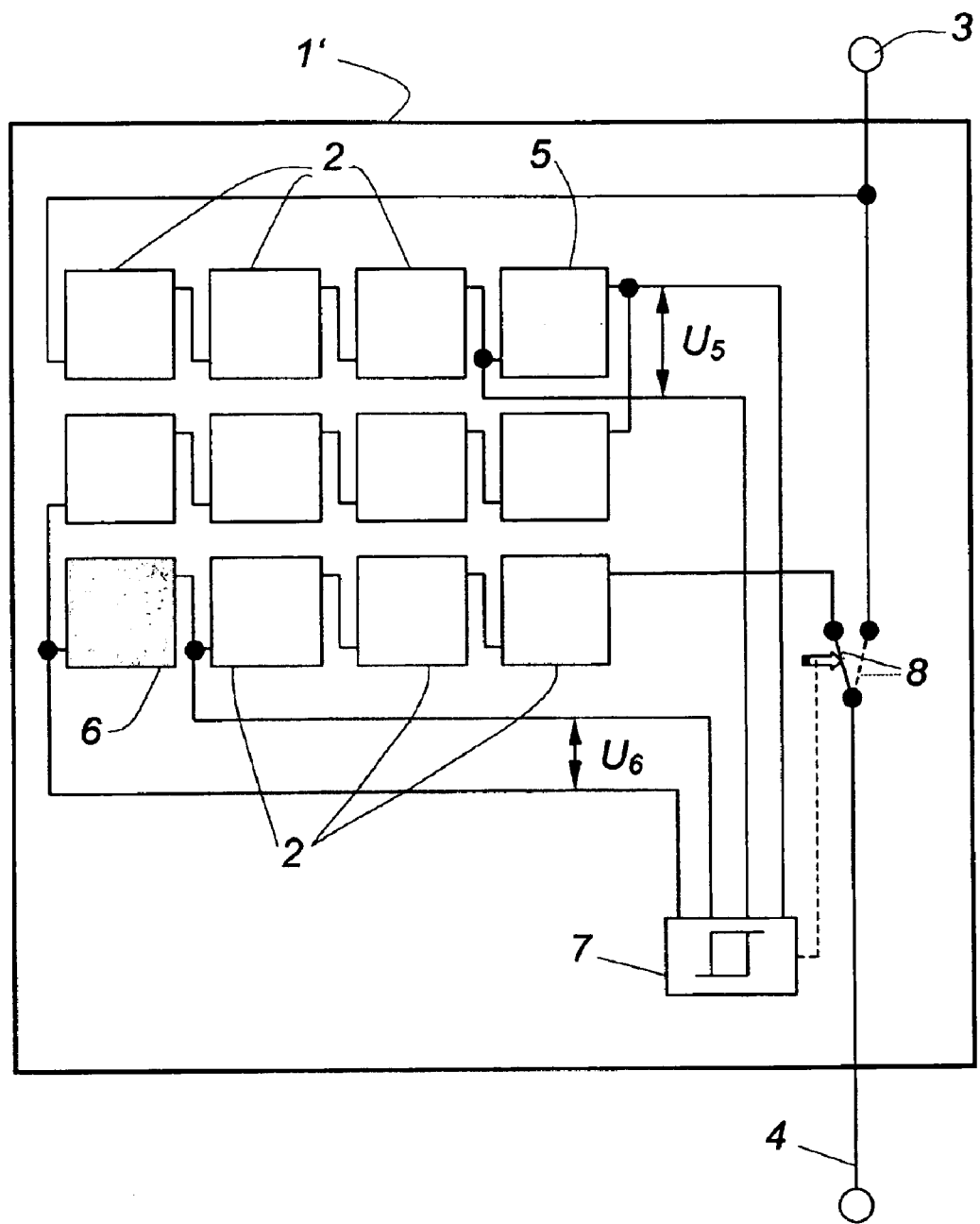
FIG. 2 represents a similar wiring block diagram of another embodiment.

In the embodiment of FIG. 2, the two detection cells 5 and 6 have been incorporated into a solar module 1' in the series circuit of the solar cells 2, the remainder of the configuration being unchanged. Through (additional) measurement conductors which are again characterized in pairs by the measurement voltages $U_5$ and $U_6$, the instantaneous output voltage of the two cells is tapped off at high ohmic value from their two connections. Obviously, the tapping off of the measurement voltages should not influence the output of the detection cells 5 and 6 inside the series circuit. These measurement voltages are conveyed to the evaluation circuit according to FIG. 1. As compared with the embodiment described first, this configuration has the advantage that the detection cells remain integrated into the production of current of the solar module 1'. Moreover, the parallel measurement conductors must be introduced in addition and the measurement signals must be galvanically decoupled in an appropriate manner.

In both embodiments, the switching device 8 exhibits a quiescent state in which it affords a link between the series circuit of the solar cells 2 and the external hookup 4 of the solar module 1 or 1'. In this situation, there is an uninterrupted current path between the external hookup 3 and the external hookup 4 by way of the series circuit of solar cells 2. In the activated state (represented dashed), the switching device connects a short-circuit between the two external connections 3 and 4 of the solar module 1/1'. At the same time, it separates the series circuit of the solar cells 2 from the output hookup 4. This ensures that no voltage is applied to the series circuit from the outside. Although for the sake of clarity, the switching device 8 has been represented here in the form of an electromechanical switch (relay), it is understood that appropriate semiconductor switches can also be used there.

The evaluation circuit 7 comprises among other things a comparator circuit of the state of the art, which detects any discrepancy between the output signals (for example the voltages $U_5$–$U_6$ or the currents $I_5$–$I_6$) applied to it by the two solar detection cells. Depending on requirements, it is also furnished with means of galvanic decoupling of the signals of the detection cells 5 and 6. It is obvious that in the arrangement of FIG. 2, evaluation of the currents passing through the two detection cells might not be able to afford the desired result, because these currents are necessarily always identical since the connection is in series.

If the incident light is identical on the entire surface of the solar module or at least on the two solar detection cells, their output voltages or currents are not different or are only negligibly so. On the other hand, if following local shadowing of the solar module, one of the solar detection cells is struck by less light than the other, a marked difference appears between their output voltages (just as in the arrangement of FIG. 1, between their currents). This difference is compared with a predetermined threshold value (possibly located, in an adjustable manner, in the evaluation circuit). If the difference exceeds the threshold value, a switching stage of the evaluation circuit 7 activates the switching device 8 to its activated state. The current originating from other modules hooked up upstream or downstream can then pass unimpeded through the direct link (shunt) thus established between the two external connections 3 and 4 of the solar module. Likewise, unproductive consumption of current in the disconnected solar module is safely prevented.

If the shadow cast locally on the solar module disappears (for example because the position of the sun has changed) or else if the same conditions of incident light build up on the two solar detection cells, the difference between the output voltages (or between the currents, in FIG. 1) of the two solar detection cells decreases and returns to zero. The evaluation circuit 7 detects this situation and restores the switching device 8 to its quiescent state, possibly with a certain switching delay (hysteresis). The solar module 1 is again connected and ready to deliver its power.

What is claimed is:

1. A process for managing a photovoltaic solar module comprising a plurality of solar cells connected electrically in series between two external connections as a function of instantaneous incident light, the process comprising:

detecting at least two variable measurement signals from at least two of the solar cells which are spaced from each other in the solar module and defined as detection cells, said measurement signals depending on the incident light on the at least two solar cells;

evaluating the at least two variable measurement signals in an evaluation circuit;

using a switching device slaved to the evaluation circuit, bypassing the external connections of the solar module when the difference between the measurement signals exceeds a threshold value; and removing the bypassing of the external connections when the difference between the measurement signals is lower than the threshold value.

2. The process of claim 1, wherein electrical output signals created directly by the detection cells are evaluated as measurement signals.

3. The process of claim 1, wherein the at least two variable measurement signals are voltages.

4. The process of claim 1, wherein the at least two variable measurement signals are currents.

5. The process of claim 1, wherein temperatures detected on the detection cells are evaluated as measurement signals.

6. A process for managing a plurality of solar cells electrically connected in series in a photovoltaic module between two external connections, the process comprising:

spacing at least two of the solar cells from each other and defining the spaced solar cells as detection cells;

detecting a measurement signal from each of the detection cells, the measurement signal varying as a function of instantaneous incident light;

comparing the measurement signals in an evaluation circuit; and bypassing the external connections of the solar module when a difference between the measurement signals exceeds a threshold value.

7. The process of claim 6, further comprising:

removing the bypassing of the external connections when the difference between the measurement signals does not exceed the threshold value.

8. The process of claim 6, wherein the measurement signals are voltages.

9. The process of claim 6, wherein the measurement signals are currents.

10. The process of claim 6, wherein the spaced solar cells are disposed proximate different edges of the photovoltaic module.

11. A solar module comprising a first module comprising:

a plurality of individual solar cells connected together electrically in series, with at least two of the solar cells being spaced from each other and serving as sensors for creating measurement signals as a fimction of instantaneous incident light on the solar module;

an evaluation circuit for comparing the measurement signals;

a switching device slaved at least indirectly to the sensors to act on the output electric power of the solar module; and a shunt that bypasses the series circuit of at least some of the solar cells when a difference between the measurement signals exceeds a threshold value.

12. The solar module of claim 11, wherein the solar cells serving as sensors are integrated into the series circuit of the other solar cells and are linked in addition to the evaluation circuit for the transferring of the measurement signals.

13. The solar module of claim 11, wherein the evaluation circuit and the switching circuit are disposed within the solar module.

14. The solar module of claim 11, wherein the plurality of individual solar cells are provided in at least two pairs of cells with a separate switching device provided to each pair.

15. The solar module of claim 11, wherein the solar cells are connected electricaily in a series circuit between two external connections, and the switching device separates the series circuit from at least one of the external connections upon activation by the evaluation circuit.

16. The solar module of claim 11, the solar cells used as sensors are each disposed proximate an edge of the solar module.

17. The solar module of claim 11, wherein the switching device comprises an electromechanical relay.

18. The solar module of claim 11, wherein the switching device comprises a semiconductor power switch able to be slaved.

19. The solar module of claim 11, wherein the evaluation circuit switches the switching device into a quiescent state when approximately identical incident light is received on the solar cells used as sensors.

20. The solar module of claim 11, further comprising at least one additional first module, wherein the first modules are connected to each other in series.

21. A solar module comprising a first module comprising:

a plurality of individual solar cells connected together electrically in series, at least two solar cells, not integrated into the series circuit of the plurality of individual solar cells, being spaced from each other and serving as sensors for creating measurement signals as a function of instantaneous incident light on the solar module;

an evaluation circuit for comparing the measurement signals;

a switching device slaved at least indirectly to the sensors to act on the output electric power of the solar module; and a shunt that bypasses the series circuit of at least some of the solar cells when a difference between the measurement signals exceeds a threshold value, wherein the solar cells serving as sensors are linked only to the evaluation circuit for the transferring of the measurement signals.

* * * * *